United States Patent [19]

Tanaka et al.

[11] Patent Number: 4,890,016

[45] Date of Patent: Dec. 26, 1989

[54] OUTPUT CIRCUIT FOR CMOS INTEGRATED CIRCUIT WITH PRE-BUFFER TO REDUCE DISTORTION OF OUTPUT SIGNAL

[75] Inventors: Fuminari Tanaka; Satoshi Nonaka, both of Tokyo, Japan

[73] Assignee: Kabushiki Kaisha Toshiba, Kawasaki, Japan

[21] Appl. No.: 197,979

[22] Filed: May 24, 1988

[30] Foreign Application Priority Data

May 29, 1987 [JP] Japan ................................. 62-133774

[51] Int. Cl.$^4$ .................... H03K 13/013; H03K 17/16; H03K 17/04; H03K 19/017
[52] U.S. Cl. .................................... 307/443; 307/542; 307/572; 307/242; 307/605; 330/264; 330/295
[58] Field of Search ............... 307/585, 576, 579, 601, 307/602, 603, 604, 605, 451, 270, 268, 592, 594, 242, 443, 542, 572; 330/264, 295

[56] References Cited

U.S. PATENT DOCUMENTS

| | | | |
|---|---|---|---|
| 3,378,783 | 4/1968 | Gibson | 307/605 X |
| 4,065,715 | 12/1977 | Jaffe et al. | 307/242 X |
| 4,103,188 | 7/1978 | Morton | 307/570 |
| 4,464,581 | 8/1984 | Oritani | 307/571 X |
| 4,737,670 | 4/1988 | Chan | 307/603 X |
| 4,782,253 | 11/1988 | Shoji | 307/602 |
| 4,785,203 | 11/1988 | Nakamura | 307/572 X |
| 4,786,824 | 11/1988 | Masuda | 307/601 X |

OTHER PUBLICATIONS

Japanese Patent Disclosure (Kokai) No. 61-244124.

*Primary Examiner*—Stanley D. Miller
*Assistant Examiner*—David R. Bertelson
*Attorney, Agent, or Firm*—Finnegan, Henderson, Farabow, Garrett and Dunner

[57] ABSTRACT

An output circuit includes a plurality of output buffer circuits and a plurality of pre-buffer circuits connected to drive the output buffer circuits. Some of the pre-buffer circuits are each constituted by P- and N-channel MOS transistors having channel widths or channel lengths which are large enough to drive the output buffer circuits, and the remaining pre-buffer circuits are each constituted by P- and N-channel MOS transistors whose channel widths and channel lengths are so determined as to set the current driving ability thereof sufficiently smaller than that of the corresponding output buffer circuits.

24 Claims, 4 Drawing Sheets

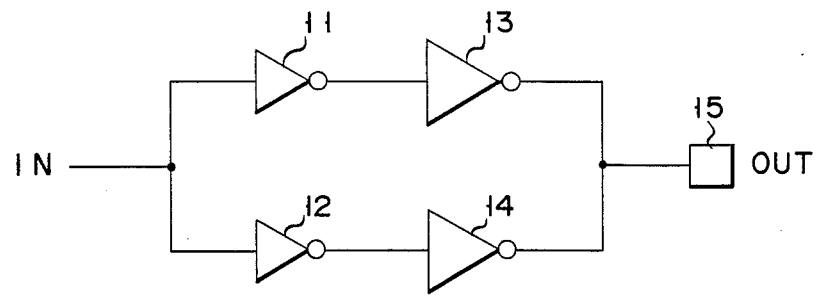
F I G. 1
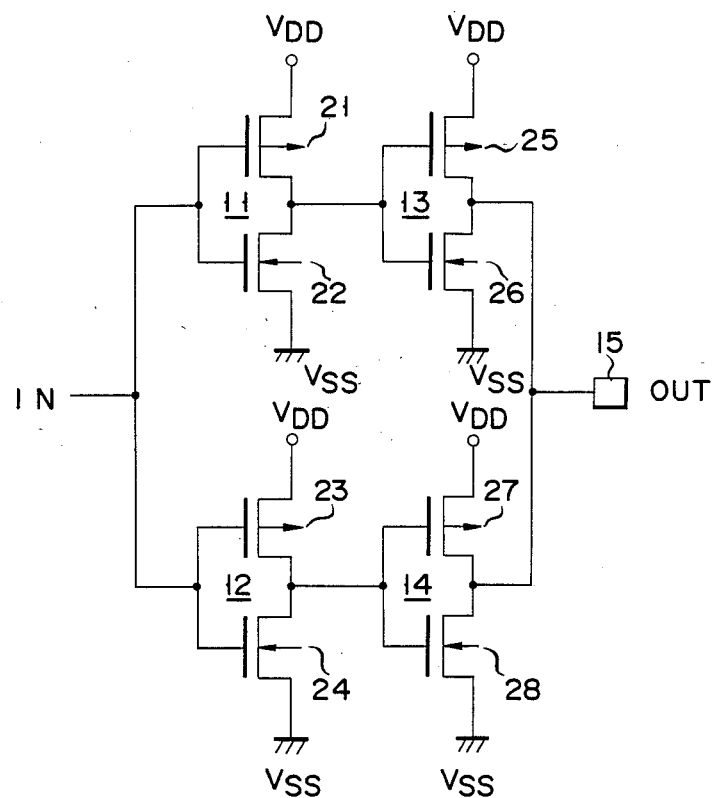
F I G. 2

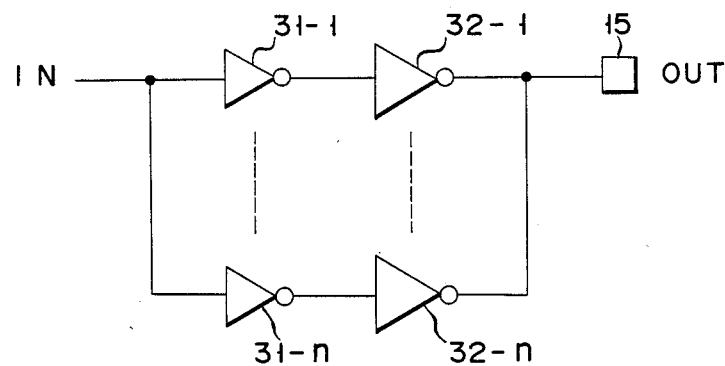
F I G. 5
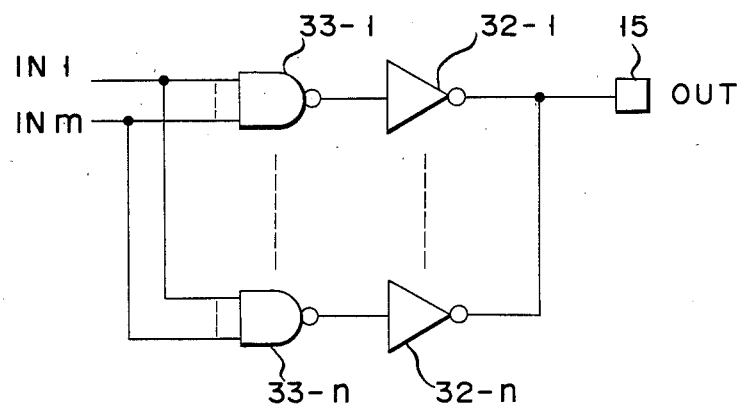
F I G. 6

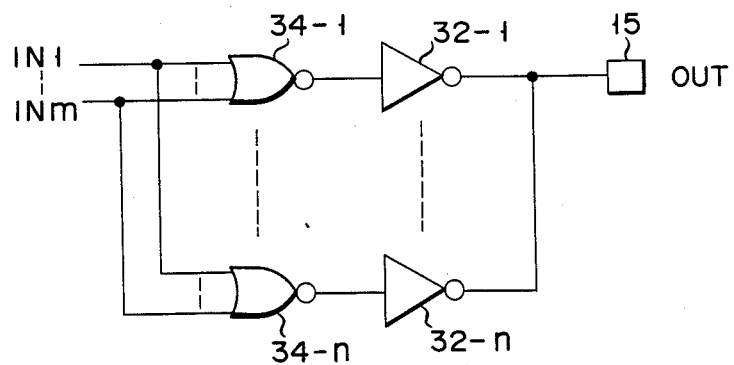
F I G. 7
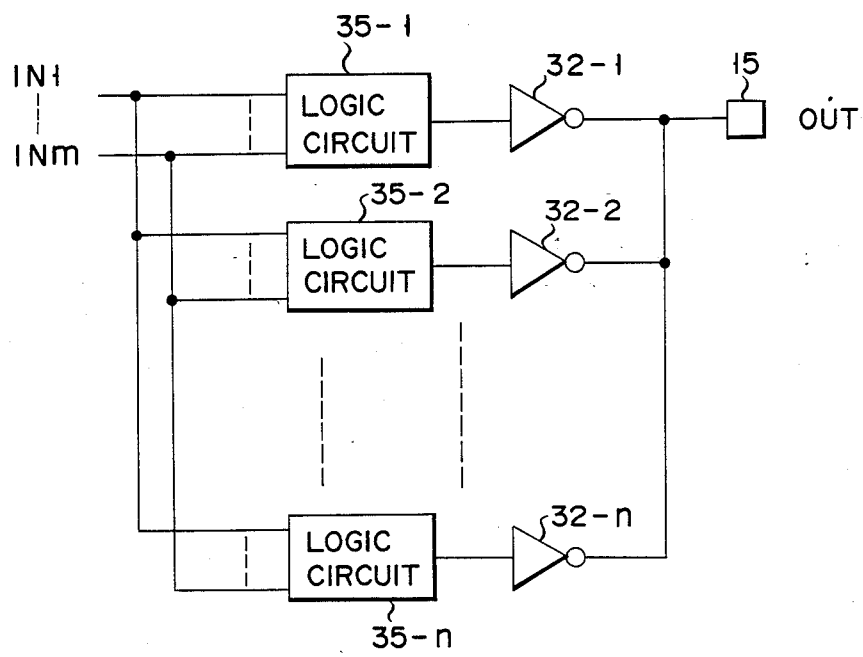
F I G. 8

4,890,016

OUTPUT CIRCUIT FOR CMOS INTEGRATED CIRCUIT WITH PRE-BUFFER TO REDUCE DISTORTION OF OUTPUT SIGNAL

BACKGROUND OF THE INVENTION

1. Field of the Invention

This invention relates to an output circuit contained in a CMOS semiconductor integrated circuit to externally generate an output signal, and more particularly to an output circuit capable of producing an output signal whose waveform distortion is reduced.

2. Description of the Related Art

In an output stage of a semiconductor integrated circuit (which is hereinafter referred to as an IC), an output circuit for deriving out an output signal from an internal circuit of the IC is provided. The prior art output circuit which has been used in the MOS IC includes a pre-buffer circuit and an output buffer circuit. The pre-buffer circuit is formed of a CMOS inverter connected to receive a signal from the internal circuit of the IC, and the output buffer circuit includes a CMOS inverter connected to receive an output signal from the pre-buffer circuit. The current driving ability of the output buffer circuit is set sufficiently larger than that of the pre-buffer circuit. For example, the channel widths of MOS transistors constituting the output buffer circuit are set larger than those of MOS transistors constituting the pre-buffer circuit. An output signal of the output buffer circuit is supplied externally as an IC output signal from the IC.

It is well known in the art that, in operation of the output buffer circuit or at the time of switching operations of the MOS transistors constituting the output buffer circuit, distortion due to the overshoot or undershoot occurs in the waveform of the output signal. The waveform distortion in the output signal is caused by resistive, capacitive and inductive loads associated with power source lines for supplying a power source voltage and output lead wires for transmitting the output signal. With the enhancement of the operation speed of the IC and increase in the output current of the IC, it is required to attain, in the CMOS output circuit, the delay time characteristics and large output current which can be attained when a signal is transmitted in the Schottky TTL. In order to meet the requirement, it is necessary to increase the mutual conductances of the MOS transistors constituting the output buffer circuit. When the mutual conductance of the MOS transistor is increased, the waveform distortion in the output signal becomes large and cannot be neglected.

In the prior art, in order to suppress the waveform distortion in the output signal to a minimum, a super-high-speed diode or an inductor formed of ferrite beads called EMI-FIL is externally connected to the signal output terminal of the IC. However, use of the diode and EMI-FIL results in high cost, increase in the number of manufacturing steps to thereby raise the manufacturing cost, and increase in the occupation area. As a result, the cost of the printed circuit board on which the IC is mounted becomes high.

SUMMARY OF THE INVENTION

An object of this invention is to provide an output circuit which can suppress the waveform distortion in an output signal to a minimum without using externally-connected parts.

According to one aspect of this invention, there is provided an output circuit comprising a plurality of pre-buffer circuits connected to receive the same signal in parallel and each including P- and N-channel MOS transistors, the P- and N-channel MOS transistors of at least one of the pre-buffer circuits being formed differently in at least one of the channel width and channel length from the P- and N-channel MOS transistors in the remaining pre-buffer circuits; a plurality of output buffer circuits respectively connected to the pre-buffer circuits to receive output signals from the corresponding pre-buffer circuits; and a signal output terminal commonly connected to the output terminals of the output buffer circuits.

With this construction, output signals of the prebuffer circuits are different from one another in the signal propagation time and in the amplitude, and therefore output signals supplied from the output buffer circuits will be different in variation speed. Since the rise and fall of an output signal appearing at the signal output terminal are determined based on the output signals of the output buffer circuits, variation in potential level of the output signal will be delayed. The resultant current driving ability of the output circuit is determined by the sum of output currents of the output buffer circuits. The instantaneous current driving ability of the output circuit is held small during the time from the beginning until the final output state is set up. Thus, variation in potential of the output signal is delayed without lowering the total current driving ability of the output circuit, thereby reducing the waveform distortion. In this way, there is provided an output circuit which can suppress the waveform distortion in the output signal to a minimum without using externally-connected parts.

BRIEF DESCRIPTION OF THE DRAWINGS

FIG. 1 is a circuit diagram showing the construction of an output circuit according to one embodiment of this invention;

FIG. 2 is a circuit diagram showing a detail construction of the output circuit of FIG. 1;

FIG. 5 is a circuit diagram showing the construction of an output circuit of a second embodiment of this invention;

FIG. 6 is a circuit diagram showing the construction of an output circuit of a third embodiment of this invention;

FIG. 7 is a circuit diagram showing the construction of an output circuit of a fourth embodiment of this invention; and FIG. 8 is a circuit diagram showing the construction of an output circuit of a fifth embodiment of this invention.

DETAILED DESCRIPTION OF THE PREFERRED EMBODIMENTS

Figure 3:
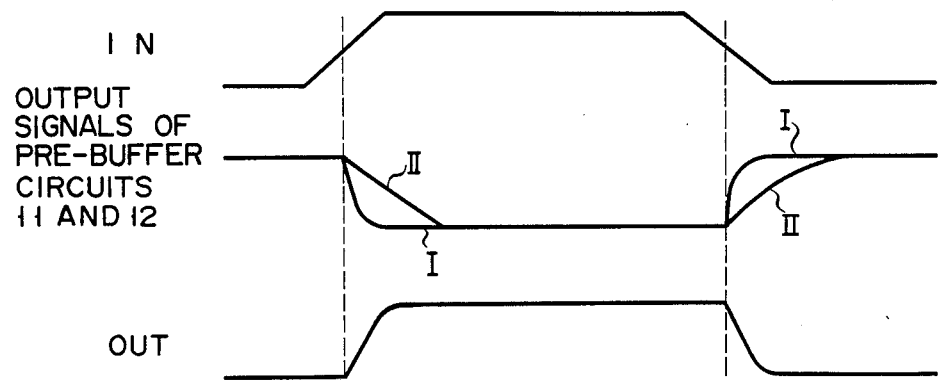
FIG. 3 is a waveform diagram of various signals in the output circuit shown in FIGS. 1 and 2.

FIG. 1 is a circuit diagram showing the construction of an output circuit of a first embodiment of this invention. In the prior art output circuit, a single pre-buffer circuit and a single buffer output circuit are provided to process an output signal from the internal circuit. In the output circuit of the first embodiment, two pre-buffer circuits and two buffer output circuits are provided. In other words, the output circuit of the first embodiment can be regarded as being equivalent to that obtained by using two sets of the prior art output circuits. Pre-buffer circuits 11 and 12 are connected to receive signal IN from the internal circuit (not shown) of the IC in parallel. Output signals from pre-buffer circuits 11 and 12 are supplied to output buffer circuits 13 and 14, respectively. Output terminals of output buffer circuits 13 and 14 are connected commonly to a single signal output terminal (output pad) 15.

FIG. 2 is a circuit diagram showing a detail construction of the output circuit of FIG. 1. Pre-buffer circuit 11 is constituted by a CMOS inverter which is formed of P-channel MOS transistor 21 and N-channel MOS transistor 22. Pre-buffer circuit 12 is constituted by a CMOS inverter which is formed of P-channel MOS transistor 23 and N-channel MOS transistor 24. Output buffer circuit 13 which is connected to receive an output signal from pre-buffer circuit 11 is constituted by a CMOS inverter which is formed of P-channel MOS transistor 25 and N-channel MOS transistor 26. Output buffer circuit 14 which is connected to receive an output signal from pre-buffer circuit 12 is constituted by a CMOS inverter which is formed of P-channel MOS transistor 27 and N-channel MOS transistor 28.

The sum of the channel widths of P-channel MOS transistors 25 and 27 constituting output buffer circuits 13 and 14 is set equal to the channel width of a single P-channel MOS transistor constituting the prior art output buffer circuit. Further, the sum of the channel widths of N-channel MOS transistors 26 and 28 is set equal to the channel width of a single N-channel MOS transistor constituting the prior art output buffer circuit. As a result, the same output current level of output signal OUT as that in the prior art circuit can be obtained in the circuit of this invention. Further, the channel widths of MOS transistors 21 and 22 constituting pre-buffer circuit 11 are set sufficiently large to drive output buffer circuit 13. The channel widths of MOS transistors 23 and 24 constituting pre-buffer circuit 12 are set sufficiently small in comparison with those of MOS transistors 21 and 22 constituting prebuffer circuit 11. In addition, the channel lengths of MOS transistors 23 and 24 constituting pre-buffer circuit 12 are set sufficiently large in comparison with those of MOS transistors 21 and 22 constituting prebuffer circuit 11. Further, the lengths of the MOS transistors constituting output buffer circuits 13 and 14 are properly determined by the delay time of a signal to be transmitted and the channel widths and channel lengths of the MOS transistors constituting pre-buffer circuits 11 and 12. Values of examples 1 and 2 indicated in the following table-1 can be used as channel width W and channel length L to satisfy the above condition.

TABLE 1

| | | MOS TRANSISTORS | | | | | | |
|---|---|---|---|---|---|---|---|---|
| | | 21 | 22 | 23 | 24 | 25 | 26 | 27 | 28 |
| EX-1 | CHANNEL WIDTH W(μm) | 600 | 200 | 50 | 20 | 1300 | 500 | 400 | 200 |
| | CHANNEL LENGTH L(μm) | 2 | 2 | 10 | 10 | 2 | 2 | 2 | 2 |
| EX-2 | CHANNEL WIDTH W(μm) | 600 | 200 | 20 | 10 | 1400 | 600 | 300 | 100 |
| | CHANNEL LENGTH L(μm) | 2 | 2 | 6 | 6 | 2 | 2 | 2 | 2 |

There will now be described an operation of the output circuit with the above construction with reference to the waveforms shown in FIG. 3. When signal IN from the internal circuit of the IC is set to a high level, an output signal of pre-buffer circuit 11 is rapidly lowered to a low level as shown by solid line I. This is because channel lengths L of MOS transistors 21 and 22 in pre-buffer circuit 11 are relatively short and channel widths are relatively large, and the current driving abilities thereof are relatively large. In contrast, channel lengths L of MOS transistors 23 and 24 in pre-buffer circuit 12 are relatively long and channel widths are relatively small, and the current driving abilities thereof are relatively small. Therefore, an output signal of pre-buffer circuit 12 is slowly lowered to a low level as shown by solid line II with respect to the waveform shown by solid line I. Output buffer circuit 13 which is connected to receive an output signal of pre-buffer circuit 11 having a relatively large current driving ability is operated at a high speed, and the output signal rises to a high level with a relatively short delay time. In contrast, output buffer circuit 14 which is connected to receive an output signal of pre-buffer circuit 12 having a relatively small current driving ability is operated at a low speed, and the output signal rises to a high level with a relatively long delay time. Therefore, when output signal OUT changes from the low level to the high level, output buffer circuit 13 is operated as a dominant driving circuit. The current driving ability of output buffer circuit 13 itself is set smaller than that of the output buffer circuit of the prior art output circuit. Therefore, rise time of output signal OUT is delayed, and distortion due to the overshoot occurring at the time of rise of the output signal can be suppressed to a minimum. After this, an output signal of output buffer circuit 14 rises to a high level. Since the total sum of channel widths W and the total sum of channel lengths L of MOS transistors 25 to 28 constituting output buffer circuits 13 and 14 are set equal to those of the output buffer circuits of the prior art output circuit, the resultant current ability of the output circuit is the same as that of the prior art output circuit.

The similar operation to the above operation occurs when signal IN from the internal circuit of the IC is lowered from the high level to the low level. Therefore, distortion of the output signal due to the undershoot occurring at the time of fall of the output signal can be suppressed to a minimum.

In the output circuit of the above embodiment, since the rise time and fall time of output signal OUT are delayed, the operation speed of the IC is lowered. However, the delay occurs only in the output circuit section, and the internal circuit of the IC can be operated at a high speed so that the operation speed of the IC in its entirety will not be considerably lowered.

Thus, according to the first embodiment, distortion of output signal OUT due to the overshoot and undershoot can be suppressed to a minimum without connecting an additional element such as a superhigh-speed switching diode and EMI-FIL to signal output terminal 15.

Figure 4:
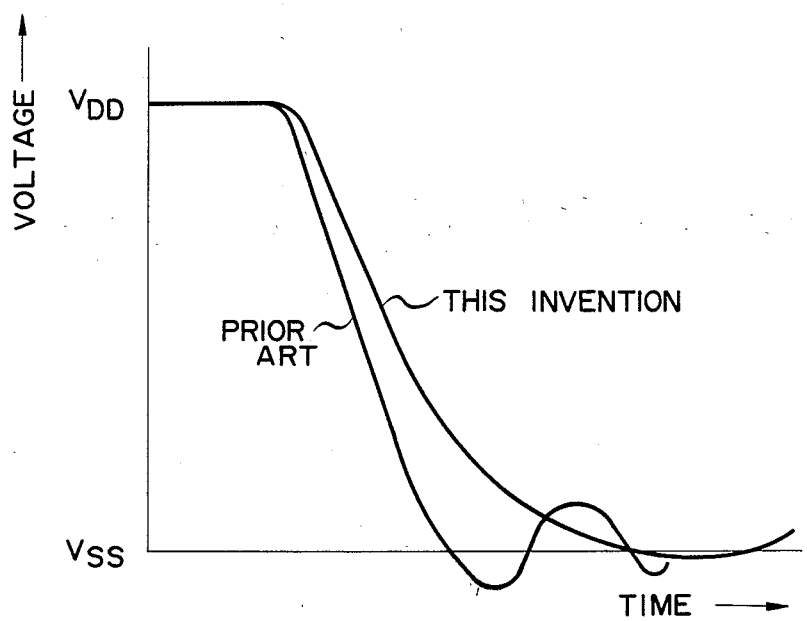
FIG. 4 is a waveform diagram comparatively showing output signals of the prior art circuit and the circuit of the first embodiment.

FIG. 4 is a waveform diagram showing variation in the waveform of output signal OUT which changes from the high level to the low level in the output circuit of the first embodiment and in the prior art output circuit. As is clearly seen from FIG. 4, the undershoot is effectively minimized in the output circuit of the first embodiment, and distortion of the waveform of the output signal is sufficiently suppressed.

FIG. 5 is a circuit diagram of an output circuit of a second embodiment of this invention. In the output circuit of the first embodiment shown in FIG. 1, each of the pre-buffer circuit and output buffer circuit is constituted by two CMOS inverters. However, in the output circuit of the second embodiment, the pre-buffer circuit includes n (which is an integer larger than 3) CMOS inverters 31-1 to 31-n, and the output buffer circuit includes n CMOS inverters 32-1 to 32-n. The channel widths or channel lengths of the P- and N-channel MOS transistors of some of CMOS inverters 31 are set so as to suppress the propagation time delay, and the channel widths or channel lengths of the P- and N-channel MOS transistors of some of the remaining CMOS inverters are so determined that an output signal may take a long propagation time to reach a final voltage level.

With the above construction, distortion in the waveform of an output signal can be reduced in the same manner as in the first embodiment. Further, in the output circuit of the second embodiment, variation in the waveform of the output signal can be determined more freely than in the first embodiment by properly setting channel widths W and channel lengths L of MOS transistors constituting CMOS inverters 31-1 to 31-n used as the pre-buffer circuits and CMOS inverters 32-1 to 32-n used as the output buffer circuits. Accordingly, it becomes possible to design the output circuit so as to attain the property required by a succeeding circuit to which an output signal of the output circuit is supplied.

FIGS. 6, 7 and 8 are circuit diagrams of output circuits according to third, fourth and fifth embodiments of this invention. In the first and second embodiments, each of the pre-buffer circuits is constituted by a CMOS inverter. However, in the third embodiment of FIG. 6, m-input (m is an integer larger than 2) NAND circuits 33-1 to 33-n of CMOS structure are used as the pre-buffer circuits. In the fourth embodiment of FIG. 7, m-input NOR circuits 34-1 to 34-n of CMOS structure are used as the pre-buffer circuits. Further, in the fifth embodiment of FIG. 8, general m-input logic circuits 35-1 to 35-n of CMOS structure are used as the pre-buffer circuits.

In each of the embodiments of FIGS. 6 to 8, the channel widths or channel lengths of the P- and N-channel MOS transistors connected to receive a signal which is one of input signals supplied to NAND circuits 33, NOR circuits 34 or logic circuits 35 used as the pre-buffer circuits and whose level is lastly determined among the input signals are set to different values from those of the P- and N-channel MOS transistors of the other pre-buffer circuits.

In the same manner as in the first and second embodiments, distortion of output signal OUT due to the overshoot and undershoot can also be suppressed to a minimum without connecting an additional element such as a superhigh-speed switching diode and EMI-FIL to signal output terminal 15 in the third to fifth embodiments.

In the third to fifth embodiments, the number of the pre-buffer circuits or output buffer circuits can be set to 2, that is, it is possible to set n to 2.

What is claimed is:

1. An output circuit of a CMOS semiconductor integrated circuit comprising:
    a plurality of CMOS pre-buffer means for receiving the same input signal and outputting a plurality of output signals with different delay times, each including P- and N-channel MOS transistors, each of the P- and N-channel MOS transistors of at least one of said pre-buffer means being formed differently in that the channel width is relatively narrow and channel length is relatively long to provide said pre-buffer means with a relatively small current driving capacity compared to the remaining pre-buffer means;
    a plurality of CMOS output buffer means, each respectively connected to a corresponding one of said plurality of pre-buffer means, for receiving the plurality of output signals with different delay times from said pre-buffer means and for outputting the plurality of output signals with a greater current driving capacity than the pre-buffer means; and
    a signal output terminal commonly connected to the output terminals of said plurality of output buffer means for providing an OUT signal.

2. An output circuit according to claim 1, wherein said pre-buffer means includes a CMOS inverter.

3. An output circuit according to claim 1, wherein said pre-buffer means includes a NAND gate.

4. An output circuit according to claim 1, wherein said pre-buffer means includes a NOR gate.

5. An output circuit according to claim 1, wherein said pre-buffer means includes a logic circuit.

6. An output circuit according to claim 1, wherein said output buffer means includes a CMOS inverter.

7. An output circuit according to claim 1, wherein said signal output terminal includes an output pad.

8. An output circuit for a CMOS integrated circuit, wherein the CMOS integrated circuit includes an internal circuit that provides an IN signal and includes an output terminal for providing an OUT signal externally from the CMOS integrated circuit, and wherein the output circuit comprises:
    pre-buffer means for receiving the IN signal and for providing a first output signal having a level that rapidly changes in response to changes in the level of the IN signal and a second output signal having a level that slowly changes in response to changes in the level of the IN signal, wherein the pre-buffer means includes
        first logic means for providing the first output signal, wherein the first logic means includes at least one transistor, each transistor having a relatively wide and short channel to provide the first logic means with a relatively large current driving capacity to rapidly change the level of the first output signal, and
        second logic means for providing the second output signal, wherein the second logic means includes at least one transistor, each transistor having a relatively narrow and long channel to provide the second logic means with a relatively small current driving capacity to slowly change the level of the second output signal;

input coupling means coupled to the internal circuit and to the pre-buffer means, for providing the IN signal to the first logic means and to the second logic means; and output buffer means coupled to the pre-buffer means and to the output terminal, and having a current driving ability greater than the current driving ability of the pre-buffer means, for receiving the first output signal from the first logic means and the second output signal from the second logic means, and for combining the first and second output signals to provide the OUT signal to the output terminal;

wherein changes in the level of the OUT signal are delayed by the slow changes in the level of the second output signal, thereby suppressing distortion of the OUT signal when the level of the IN signal changes.

9. An output circuit according to claim 8, wherein the first and second logic means are inverters.

10. An output circuit according to claim 8, wherein the first and second logic means are NAND circuits.

11. An output circuit according to claim 8, wherein the first and second logic means are NOR circuits.

12. An output circuit according to claim 8, wherein the first logic means comprises:
a P-channel MOS transistor having a gate coupled to the input coupling means, a first terminal coupled to a first fixed potential, a second terminal, and a channel coupled between the first and second terminals that is relatively wide and short; and
an N-channel MOS transistor having a gate coupled to the input coupling means, a first terminal coupled to a second fixed potential, a second terminal coupled to the second terminal of the P-channel MOS transistor, and a channel coupled between the first and second terminals that is relatively wide and short.

13. An output circuit according to claim 12, wherein the second logic means comprises:
a P-channel MOS transistor having a gate coupled to the input coupling means, a first terminal coupled to the first fixed potential, a second terminal, and a channel coupled between the first and second terminals that is relatively narrow and long; and
an N-channel MOS transistor having a gate coupled to the input coupling means, a first terminal coupled to the second fixed potential, a second terminal coupled to the second terminal of the P-channel MOS transistor, and a channel coupled between the first and second terminals that is relatively narrow and long.

14. An output circuit according to claim 8, wherein the second logic means comprises:
a P-channel MOS transistor having a gate coupled to the input coupling means, a first terminal coupled to a first fixed potential, a second terminal, and a channel coupled between the first and second terminals that is relatively narrow and long; and
an N-channel MOS transistor having a gate coupled to the input coupling means, a first terminal coupled to a second fixed potential, a second terminal coupled to the second terminal of the P-channel MOS transistor, and a channel coupled between the first and second terminals that is relatively narrow and long.

15. An output circuit according to claim 14, wherein the output buffer means comprises:

first output buffer logic means for receiving the first output signal, including
a P-channel MOS transistor having a gate, a first terminal coupled to the first fixed potential, and a second terminal, and
an N-channel MOS transistor having a gate, a first terminal coupled to the second fixed potential, and a second terminal coupled to the second terminal of the P-channel MOS transistor;
means coupled to the pre-buffer means and the first output buffer logic means, for providing the first output signal from the first logic means to the gates of the P-channel and N-channel transistors in the first output buffer logic means;
second output buffer logic means for receiving the second output signal, including
a P-channel MOS transistor having a gate, a first terminal coupled to the first fixed potential, and a second terminal, and
an N-channel MOS transistor having a gate, a first terminal coupled to the second fixed potential, and a second terminal coupled to the second terminal of the P-channel MOS transistor; and
means coupled to the pre-buffer means and the second output buffer logic means, for providing the second output signal from the second logic means to the gates of the P-channel and N-channel transistors in the second output buffer logic means.

16. An output circuit according to claim 13, wherein the output buffer means comprises:
first output buffer logic means for receiving the first output signal, including
a P-channel MOS transistor having a gate, a first terminal coupled to the first fixed potential, and a second terminal, and
an N-channel MOS transistor having a gate, a first terminal coupled to the second fixed potential, and a second terminal coupled to the second terminal of the P-channel MOS transistor;
means coupled to the pre-buffer means and the first output buffer logic means, for providing the first output signal from the first logic means to the gates of the P-channel and N-channel transistors in the first output buffer logic means;
second output buffer logic means for receiving the second output signal, including
a P-channel MOS transistor having a gate, a first terminal coupled to the first fixed potential, and a second terminal, and
an N-channel MOS transistor having a gate, a first terminal coupled to the second fixed potential, and a second terminal coupled to the second terminal of the P-channel MOS transistor; and
means coupled to the pre-buffer means and the second output buffer logic means, for providing the second output signal from the second logic means to the gates of the P-channel and N-channel transistors in the second output buffer logic means.

17. An output circuit according to claim 12, wherein the output buffer means comprises:
first output buffer logic means for receiving the first output signal, including
a P-channel MOS transistor having a gate, a first terminal coupled to the first fixed potential, and a second terminal, and
an N-channel MOS transistor having a gate, a first terminal coupled to the second fixed potential, and a second terminal coupled to the second terminal of the P-channel MOS transistor;

means coupled to the pre-buffer means and the first output buffer logic means, for providing the first output signal from the first logic means to the gates of the P-channel and N-channel transistors in the first output buffer logic means;

second output buffer logic means for receiving the second output signal, including a P-channel MOS transistor having a gate, a first terminal coupled to the first fixed potential, and a second terminal, and an N-channel MOS transistor having a gate, a first terminal coupled to the second fixed potential, and a second terminal coupled to the second terminal of the P-channel MOS transistor; and means coupled to the pre-buffer means and the second output buffer logic means, for providing the second output signal from the second logic means to the gates of the P-channel and N-channel transistors in the second output buffer logic means.

18. An output circuit according to claim 8, wherein the output buffer means comprises:

first output buffer logic means for receiving the first output signal, including a P-channel MOS transistor having a gate, a first terminal coupled to a first fixed potential, and a second terminal, and an N-channel MOS transistor having a gate, a first terminal coupled to a second fixed potential, and a second terminal coupled to the second terminal of the P-channel MOS transistor;

means coupled to the pre-buffer means and the first output buffer logic means, for providing the first output signal from the first logic means to the gates of the P-channel and N-channel transistors in the first output buffer logic means;

second output buffer logic means for receiving the second output signal, including a P-channel MOS transistor having a gate, a first terminal coupled to the first fixed potential, and a second terminal, and an N-channel MOS transistor having a gate, a first terminal coupled to the second fixed potential, and a second terminal coupled to the second terminal of the P-channel MOS transistor; and means coupled to the pre-buffer means and the second output buffer logic means, for providing the second output signal from the second logic means to the gates if the P-channel and N-channel transistors in the second output buffer logic means.

19. An output circuit according to claim 8, wherein the first logic means in the pre-buffer means provides a plurality of first output signals.

20. An output circuit according to claim 19, wherein the first logic means comprises a plurality of first logic circuits, and each first logic circuit comprises:

a P-channel MOS transistor having a gate coupled to the input coupling means, a first terminal coupled to a first fixed potential, a second terminal, and a channel coupled between the first and second terminals that is relatively wide and short; and an N-channel MOS transistor having a gate coupled to the input coupling means, a first terminal coupled to a second fixed potential, a second terminal coupled to the second terminal of the P-channel MOS transistor, and a channel coupled between the first and second terminals that is relatively wide and short.

21. An output circuit according to claim 19, wherein the second logic means in the pre-buffer means provides a plurality of second output signals.

22. An output circuit according to claim 21, wherein the second logic means comprises a plurality of second logic circuits, and each second logic circuit comprises:

a P-channel MOS transistor having a gate coupled to the input coupling means a first terminal coupled to a first fixed potential, a second terminal, and a channel coupled between the first and second terminals that is relatively narrow and long; and an N-channel MOS transistor having a gate coupled to the input coupling means, a first terminal coupled to a second fixed potential, a second terminal coupled to the second terminal of the P-channel MOS transistor, and a channel coupled between the first and second terminals that is relatively narrow and long.

23. An output circuit according to claim 8, wherein the second logic means in the pre-buffer means provides a plurality of second output signals.

24. An output circuit according to claim 22, wherein the second logic means comprises a plurality of second logic circuits, and each second logic circuit comprises:

a P-channel MOS transistor having a gate coupled to the input coupling means, a first terminal coupled to a first fixed potential, a second terminal, and a channel coupled between the first and second terminals that is relatively narrow and long; and an N-channel MOS transistor having a gate coupled to the input coupling means, a first terminal coupled to a second fixed potential, a second terminal coupled to the second terminal of the P-channel MOS transistor, and a channel coupled between the first and second terminals that is relatively narrow and long.

* * * * *